(12) United States Patent
Pate et al.

(10) Patent No.: US 6,531,926 B1
(45) Date of Patent: Mar. 11, 2003

(54) DYNAMIC CONTROL OF PHASE-LOCKED LOOP

(75) Inventors: Prayson Will Pate, Durham, NC (US); Michael Joseph Poupard, Youngsville, NC (US); Robert Leroy Lynch, Raleigh, NC (US); David Lance O'Neal, Raleigh, NC (US); Emily Jean Skinner, Raleigh, NC (US)

(73) Assignee: Overture Networks, Inc., Research Triangle Park, NC (US)

( * ) Notice: Subject to any disclaimer, the term of this patent is extended or adjusted under 35 U.S.C. 154(b) by 0 days.

(21) Appl. No.: 10/241,015

(22) Filed: Sep. 11, 2002

Related U.S. Application Data

(60) Provisional application No. 60/318,814, filed on Sep. 13, 2001.

(51) Int. Cl.[7] .............................. H03L 7/00; H03L 7/06; H03L 7/08
(52) U.S. Cl. .............................. 331/17; 331/10; 331/18; 331/25; 375/376
(58) Field of Search .............................. 331/1 A, 10, 16, 331/17, 18, 25, DIG. 2; 327/156–159; 360/51; 375/376; 455/260

(56) References Cited

U.S. PATENT DOCUMENTS

| | | |
|---|---|---|
| 5,933,058 A | 8/1999 | Pinto et al. |
| 5,955,928 A | 9/1999 | Smith et al. |
| 6,252,465 B1 | 6/2001 | Katoh |
| 6,329,882 B1 * | 12/2001 | Fayneh et al. ................ 331/10 |
| 6,362,670 B1 | 3/2002 | Beaulieu |

OTHER PUBLICATIONS

Altera Corporation—Application Note 200 *Using PLLs In Stratix Devices*, Feb. 2002. Version 1.0. (70 pages), Altera Corporation, San Jose, California, www.Altera.com.

Altera Corporation—Application Note 217 *Using Remote System Configuration with Stratix Devices* Feb., 2002, Version 1.0. (12 pages), Altera Corporation, San Jose, California, www.Altera.com.

Altera Corporation—*PLL & Timing Glossary*, Feb. 2002, Version 1.0. (12 pages), Altera Corporation, San Jose, California, www.Altera.com.

* cited by examiner

*Primary Examiner*—David C. Mis
(74) *Attorney, Agent, or Firm*—Daniels & Daniels, P.A.; Kevin E. Flynn

(57) ABSTRACT

A Phase-locked Loop (PLL) (204) that is dynamically and automatically altered in response to changes in the jitter of the input is disclosed. The Analysis Block (304) receives one or more inputs from the PLL operation. The output of the Analysis Block (304) triggers a change in the Parametric Control Block (308) which in turn imparts changes on the gains of one or more of the various components or the value of $\omega_N$ of the PLL Low Pass Filter (116). The dynamic change to at least one parameter of the PLL adjusts the tradeoff between removing as much of the jitter as possible and having a responsive system that has a reduced risk of buffer underflow or overflow. This abstract is provided as a tool for those searching for relevant disclosures, and not as a limitation on the scope of the claims.

22 Claims, 5 Drawing Sheets

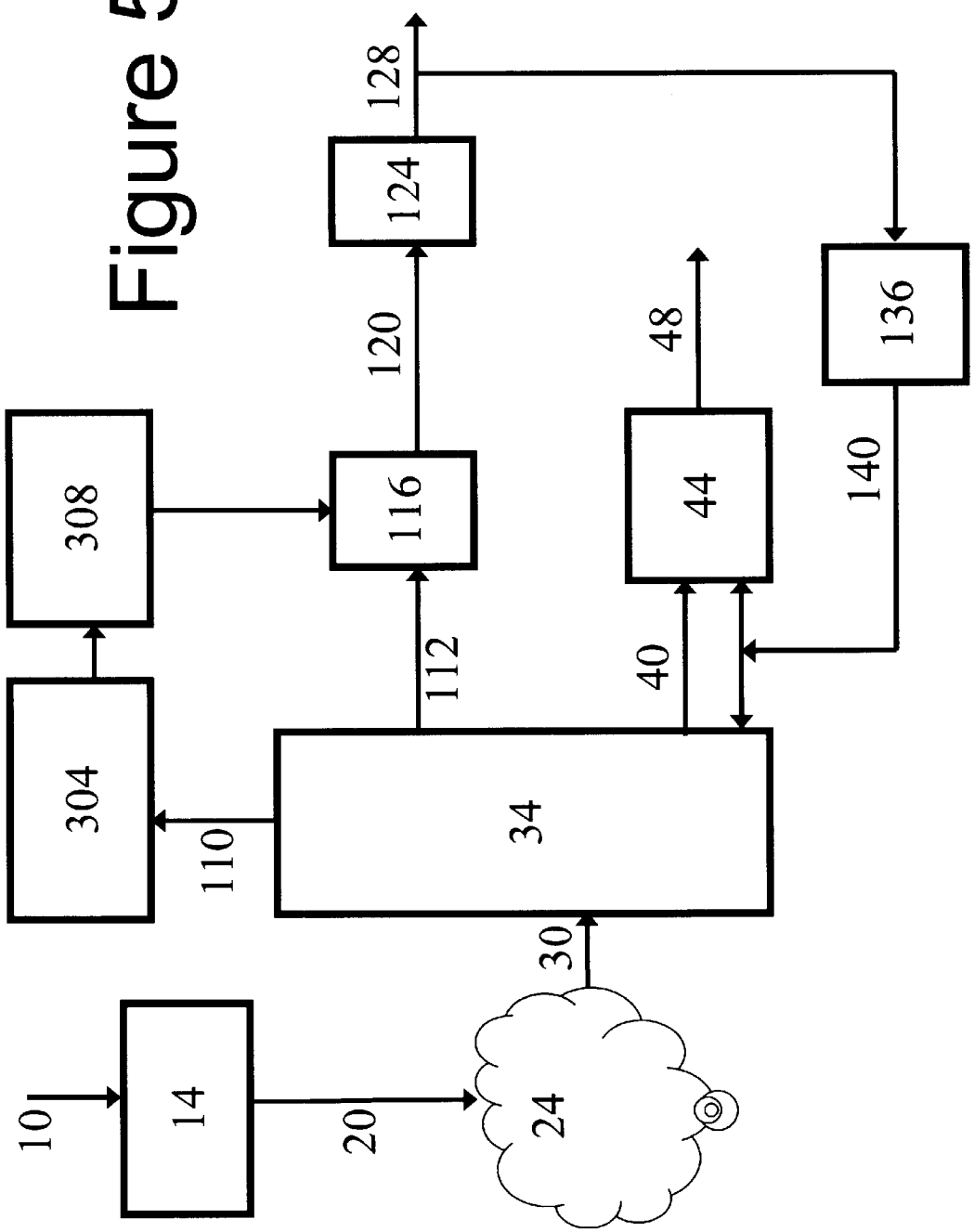

DYNAMIC CONTROL OF PHASE-LOCKED LOOP

This application claims priority from co-pending U.S. Provisional Patent Application No. 60/318,814 filed Sep. 13, 2001 for Dynamic Control of a Phase-Locked Loop.

FIELD OF THE INVENTION

This invention relates to communications systems and methods, in particular, to Phase-Locked Loops.

BACKGROUND OF THE INVENTION

Phase-Locked Loops (PLLs) are commonly used for synthesis of a smoothed clock from an irregular or jittered input clock. The smoothed clock runs at the frequency of the input clock but does not contain the some or all of the jitter present in the input clock signal. FIG. 1 shows a block diagram for a basic PLL.

A PLL like that shown in FIG. 1 is a linear system. The Phase Detector 108 measures the difference between the phase of the Input Clock 104 and the phase of the Output Clock 128. This difference, known as Phase Error 112, is then passed through a Low Pass Filter (LPF) 116 that attenuates the high-frequency components to produce a Filtered Phase Error 120. (One type of low pass filter is sometimes called an "integrator".) The Filtered Phase Error 120 is then fed into a Voltage-Controlled Oscillator (VCO) 124. The Output 132 of the VCO 124 is fed back to the Phase Detector 108 as the Reference Clock Value 140, after passing through a Divider 136. The Divider adjusts the frequency of the Reference Clock Value 140 to match the frequency of the Input Clock 104 as is necessary when the frequency of the Output 132 of the VCO 124 is set to be an integer multiple of the Input Clock frequency.

This type of system is a feedback system, and when operating properly it tends to drive the Phase Error 112 to zero (or some small value) and the Output Clock 128 will track the Input Clock 104, or at least the desired frequency components thereof.

FIG. 2 shows a typical PLL application. The jittered Input Clock 104 is used to clock Input Data 206 into the FIFO Buffer 208. It is also used as an input to the PLL 204, which provides a smoothed clock as an output 128. The smoothed Output Clock 128 is also used to clock "smooth" Output Data 210 out of the FIFO Buffer 208 that is being used as a buffer to absorb jitter from jittered Input Data 206.

A PLL has a number of parameters that are selected at design time:

Gain of the phase detector–$K_P$
Gain low pass filter (LPF)–$K_F$
Gain of the Voltage Controlled Oscillator (VCO)–$K_V$
Natural frequency of the low pass filter–$\omega_N$
The divide by value used in the divider–N The parameters control the PLL's operational characteristics as follows:

Frequency response and cutoff frequency: $F_C = \omega_N/2\pi$
Transient response and settling time: $T_S \approx 1/(2 \ast F_C)$
Steady-state phase error: $E = F_{in}/[F_{center}(1+K)]$ where $F_{center}$ is the nominal frequency of the VCO.
Tracking range: $R = R_0/(1+K)$ where $R_0$ is the nominal range of the VCO.

These operational characteristics are all inter-related. Thus, changing one parameter tends to change more than one of the operational characteristics. The design and operation of Phase-Locked Loops is within the skill of one of ordinary skill in the art. General information on this topic is readily available and thus will not be described here in any detail. Textbooks describing the design of Phase-Locked Loops include 1) Floyd Martin Gardner, "Phaselock Techniques", John Wiley & Sons, ISBN: 0471042943; 2) Roland E. Best, "Phase-Locked Loops: Design, Simulation, and Applications", McGraw-Hill Professional Publishing, ISBN: 0071349030; and 3) John J. D'Azzo, "Linear Control System Analysis and Design", McGraw-Hill, ISBN 0070161836.

The values are chosen based on knowledge of the input signal as well as the system requirements. The choice of the design parameters affects the performance of the PLL in such areas as stability, acquisition and tracking bandwidth and noise rejection. Fixed ("static") parameters mean that the PLL may not be operating in the optimal fashion as the characteristics change for the input signal.

A linear control system like a PLL can be highly optimized when the characteristics of the input signal vary only slightly. A system that worked fine for one type of input signal may not work well as the input changes. A dynamic system allows the PLL to treat the varying input in a piecewise linear fashion, giving optimum performance in each set of input conditions.

The range of values on the input signal may exceed the dynamic range of some of the PLL components. In this case, a system with fixed parameters might not work at all in some situations. A dynamic system can overcome this limitation.

Some of the PLL parameters affect multiple performance metrics such that improving one metric has a deleterious affect on another metric. For example, acquisition range and noise rejection are usually inversely proportional. A dynamic system can increase the noise rejection in the domains where the input is well behaved, and a wide acquisition range is therefore not needed.

Prior art designs fixed the values of the PLL parameters so the PLL was optimized for one set of input conditions. In some cases specialized PLLs had more than one set of fixed PLL parameters for the PLL to operate in two different modes. For example, the prior art includes the concept of a PLL that uses a more stringent set of parameters for clock signal tracking after the PLL locks onto a clock signal. This is switching the mode of operation of the PLL to perform a different function (signal tracking versus signal acquisition).

Likewise some PLLs are adapted to work with two or more different frequencies of different values. Again, the PLL can be set to one mode or another based on the frequency that is expected, but the PLL does not have dynamically adjusted parameters to react to changes in the behavior of the expected input. More specifically, if the jitter associated with an input signal changes over time, the PLL does not react by changing PLL characteristics to adjust for the increased jitter.

In February of 2002, Altera Corporation announced a new programmable logic device, the Stratix™. This device has extended support for phase-locked loops. The features include PLL reconfiguration that gives designers flexibility in multiplying or dividing input clock frequencies to achieve higher or lower output clock frequencies and allows real-time variations of the PLL frequency and output clock skew. StratixTM frequency synthesis and programmable delay features can be changed by users on-the-fly; for example, designers can modify the PLL output frequencies and clock delays in prototype environments. This feature allows for PLL reconfiguration without reprogramming the rest of the chip. Furthermore, during system debugging, users can change the certain PLL parameters to optimize the system timing.

However, while a designer has additional control over frequency and clock skew, Altera documentation specifically excludes dynamic adjustment of the PLL loop filter components. Thus, although the Altera device facilitates development of PLL functions on a programmable logic device, it does not support or suggest the use of dynamic control of PLL parameters to adapt to changes in the characteristics of a received clock signal.

It is therefore an object of the invention to provide dynamic control of a PLL based on the real time characteristics of the input signal.

SUMMARY

Several versions are disclosed of a Phase-Locked Loop with a control system to provide dynamic automatic adjustment to changes in one or more characteristics of the Phase-Locked Loop in response to changes in the jitter level of the input. These Phase-Locked Loops are responsive to changes in the input to the Phase-Locked Loops so that the operation of the Phase-Locked Loops can more closely approximate optimal settings for various levels of input jitter. One version of the invention compares a monitored jitter value against control state set points and upon detection of movement across a set point, changes one or more operating parameters of the Phase-Locked Loop. Various versions of the invention use different inputs and modify different operating parameters in order to achieve the objective of an automatic dynamic alteration of a Phase-Locked Loop in response to a change in jitter level of the input.

A version of the disclosed invention can be used as part of a circuit emulation system to receive circuit emulation payloads. In this version of the invention, the phase detector portion of the PLL is the jitter absorption buffer and the PLL uses a filtered jitter absorption buffer depth to vary the clock speed. This version of the invention uses a periodic sample of the difference between the highest and lowest levels of the jitter absorption buffer as a metric for network conditions. This metric is used by the control system to select the appropriate set of parameters for use by the PLL.

BRIEF DESCRIPTION OF THE DRAWINGS

FIG. 5 is one implementation of the present invention using a Jitter Absorption Buffer as the phase detector.

DESCRIPTION

In a preferred embodiment of the present invention, there are three control states, each with its own values of the PLL parameters. This invention can be extended to any system that dynamically changes from one set of coefficients to another based on current conditions. Thus, the number of states can be any number two or larger. Two states would probably be too coarse. It is currently felt that the optimal number of states would be from three to five states to avoid having an unduly complex system. This disclosure will explain the concept through the use of a three state example.

Likewise, the preferred embodiment of the present invention measures the current estimate of variation or jitter of the input signal, denoted J. One preferred method for estimating jitter is set forth in co-pending patent application Ser. No. 10/200,418 by Pate et al. with title Measurement of Packet Delay Variation based on earlier filed provisional patent application No. 60/307,747. The 418 application is incorporated by reference.

Figure 3:
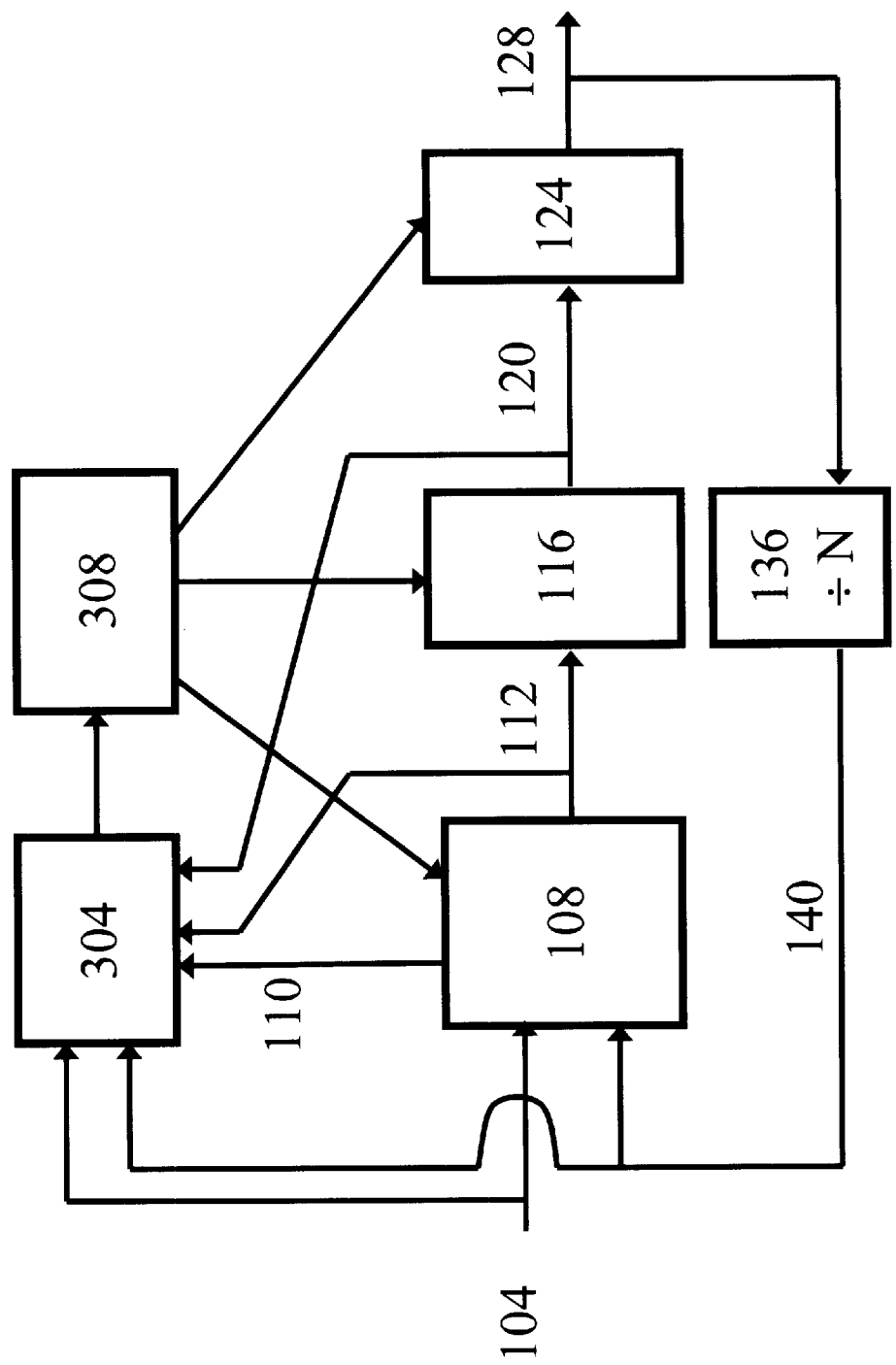
FIG. 3 shows a system to provide dynamic control of a PLL based on the real time characteristics of the input signal.
Figure 4:
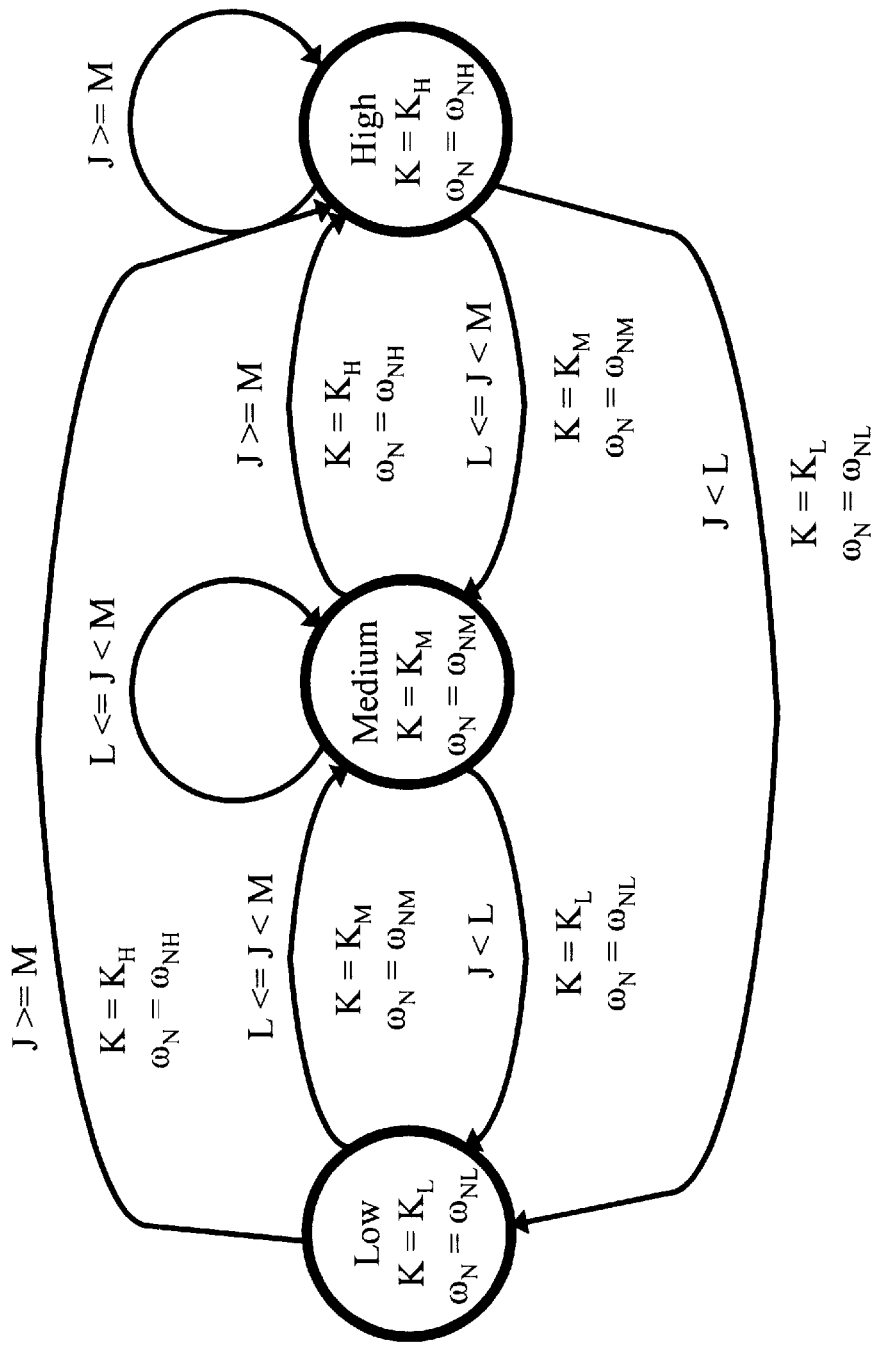
FIG. 4 is a state machine representing one preferred embodiment of the present invention.

In a preferred embodiment, the current estimate of variation or jitter of the Input Signal 110 is used to trigger the state transitions as shown in FIG. 4. As shown in FIG. 3, alternative embodiments could use the jitter of the Input Clock 104, Reference Clock Value 140, or the jitter of the Filtered Phase Error 120 for triggering state transitions. The unfiltered Phase Error 112 could also be used for triggering state transitions. However, when using the unfiltered Phase Error 112, it is likely that the Analysis Block 304 (discussed below) would need its own low pass filter so that control state decisions were not unduly influenced by high frequency components of the unfiltered Phase Error 112.

Finally, the preferred embodiment of the present invention only manipulates a single value for K. Since the PLL characteristics are controlled by the product $K_P K_F K_V$ (i.e. the individual values are not distinct with respect to operation of the PLL), the gains $K_P$, $K_F$ and $K_V$ may be consolidated into a single effective gain denoted K. The constants $K_P$, $K_F$ and $K_V$ could be manipulated separately if needed, as in an implementation where truncation errors in calculations are significant. For example, if increasing $K_P$ to a certain value in the Phase Detector 108 caused a fixed point calculation to overflow, the same effect could be accomplished by increasing $K_P$ to a lesser amount and instead increasing $K_F$ at the Low Pass Filter 116 and/or $K_V$ at the VCO 124 a corresponding amount.

Figure 1:
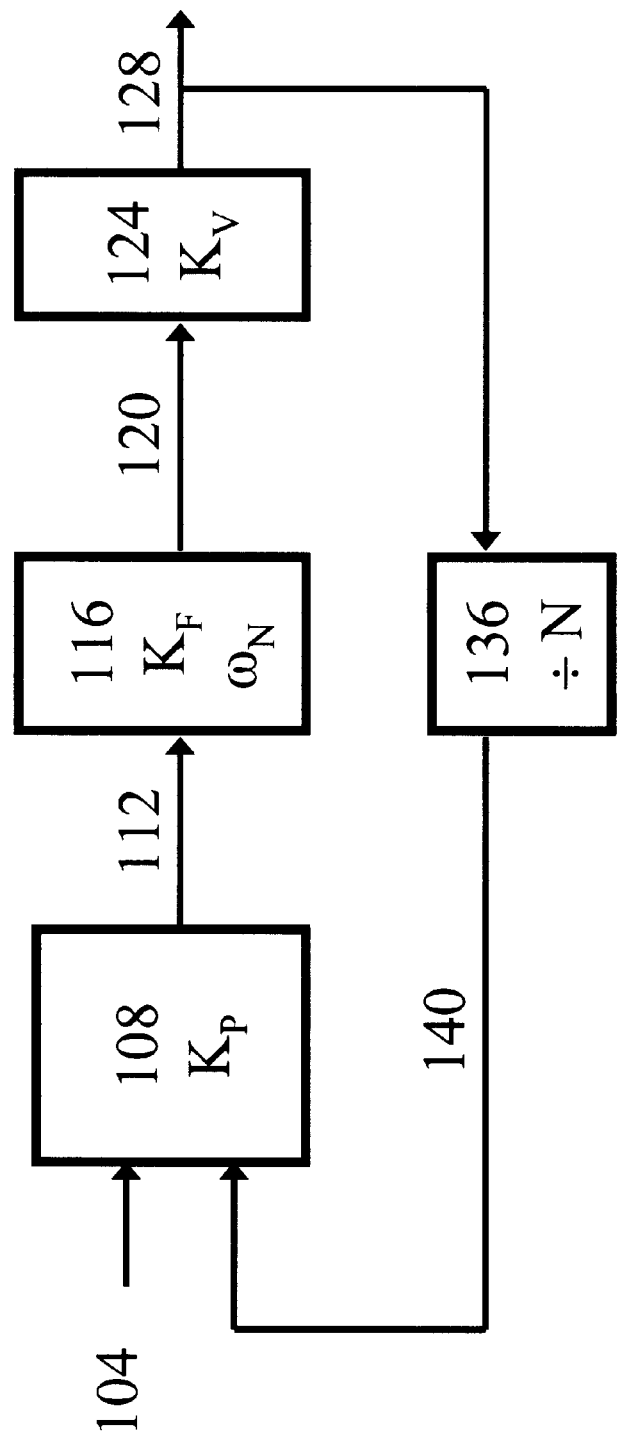
FIG. 1 shows a block diagram for a basic PLL as known in the prior art.
Figure 2:
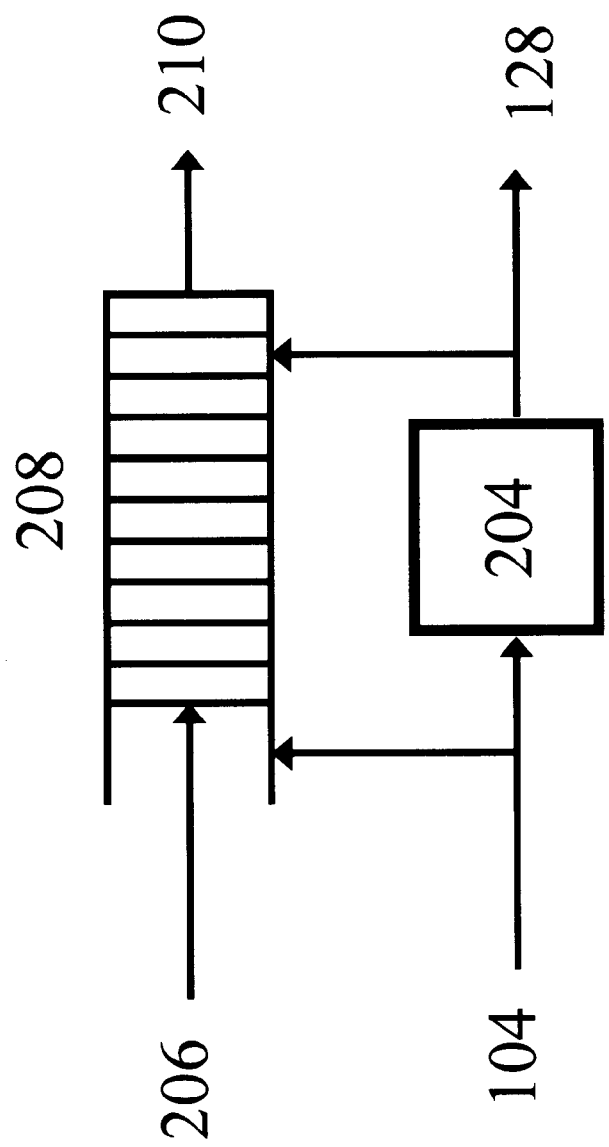
FIG. 2 shows a typical PLL application. The PLL is taking a jittered clock as an input, and providing a smoothed clock as an output, thus smoothing the clocking function for FIFO Buffer 208.

These concepts are illustrated in FIG. 3, which is a modification of FIG. 2. The modification adds an Analysis Block 304 and a Parametric Control Block 308. As shown in FIG. 3, the Analysis Block 304 receives one or more inputs from the PLL operation as mentioned above. In the preferred embodiment the Analysis Block 304 performs a comparison between the input variable and constants that mark the transition points between one state and another, such as the transition from low to medium. As described below, this simple comparison can be modified to have a dead band to prevent chatter. Those of skill in the art realize that the Analysis step could include filtering or be based on a function of two or more inputs, though simplicity favors a simple comparison based on a single input. (Note while it may seem redundant to have a filter in the Analysis Block 304, having a filter in Analysis Block 304 could be useful when the designer opts for a responsiveness in the Analysis Block 304 that is different from the desired responsiveness of the VCO 124.)

The output of the Analysis Block 304 triggers the change in the Parametric Control Block 308. As shown in FIG. 3, the parametric control block can impart changes on the gains of one or more of the various components or the value of $\omega_N$. A preferred embodiment set forth in the state machine of FIG. 4, manipulates both gain and $\omega_N$, thus illustrating that more than one parameter can be varied within the scope of the present invention.

FIG. 4 in combination with Tables 1 and 2 illustrates one preferred embodiment of the present invention. In this preferred embodiment the three states are:

Low—This is the steady state when the current value of J is low as defined by the threshold L.

Medium—This is the steady state when the current value of J is medium as defined by the thresholds L and M.

High—This is the steady state when the current value of J is high as defined by the threshold M.

Note that there are no timers in this state machine. Hysteresis could be introduced to prevent minor changes in J from triggering changes in the coefficients when J is approximately equal to L or to M. For example, the state changes would occur at L plus a first delta and L minus a second delta rather than at L. The preferred embodiment would have first delta equal to second delta so there is a dead band of width two times delta, centered on L. Table 1 shows the state transitions for each range of J.

TABLE 1

State Machine for Dynamic Control of a PLL

| | State | | |
|---|---|---|---|
| Value of J | Low | Medium | High |
| J < L | No change | 1. Set K = $K_L$<br>2. Set $\omega_N = \omega_{NL}$<br>3. → Low | 1. Set K = $K_L$<br>2. Set $\omega_N = \omega_{NL}$<br>3. → Low |
| L <= J < M | 1. Set K = $K_M$<br>2. Set $\omega_N = \omega_{NM}$<br>3. → Medium | No change | 1. Set K = $K_M$<br>2. Set $\omega_N = \omega_{NM}$<br>3. → Medium |
| J >= M | 1. Set K = $K_H$<br>2. Set $\omega_N = \omega_{NH}$<br>3. → High | 1. Set K = $K_H$<br>2. Set $\omega_N = \omega_{NH}$<br>3. → High | No change |

Table 2 shows the values of K and $\omega_N$ for each state.

TABLE 2

State Machine for Dynamic Control of a PLL

| | State | | |
|---|---|---|---|
| Parameter | Low | Medium | High |
| Gain K (Hz/bit) | 4 | 2 | 1 |
| Natural Frequency $\omega_N$ (radians/sec) | 1000 | 2000 | 4000 |
| Cutoff Frequency FC (Hz) | 159.15 | 318.31 | 636.62 |
| Steady State Error for 10 Hz Offset (bits) | 2.0 | 3.3 | 5.0 |
| Settling Time (ms) | 3.14 | 1.57 | 0.79 |
| Tracking Range ($R_0$ = 100 Hz) | 20 | 33 | 50 |

Note that the values of $\omega_N$ and K vary with the measured jitter such that the responsiveness of the PLL increases with increasing jitter.

The cutoff frequency increases with jitter

The settling time is shorter as jitter increases

The tracking range is greater

The net effect of increased responsiveness is that the PLL tracks (instead of removes) more of the jitter, reducing the likelihood of overrunning any jitter buffers that may be in the system. For example, consider the system shown in FIG. 2. The FIFO might overrun or underrun if the cutoff frequency of the PLL is set too low. Thus, there is a tradeoff between removing as much of the high frequency jitter as possible and having the output clock respond to low frequency jitter in order to reduce the risk of buffer underflow or overflow. The present invention adjusts the operating parameters to optimize performance of the PLL based on the current operating conditions.

In some applications, the change of parameters may cause the designer to take special steps to assure smooth operation of the Phase-Locked Loop. A change in natural frequency of an exponentially smoothed filter will not normally cause a disruption due to the memory factor of the filter i.e. the change is inherently smoothed over time. However, a change to the gain or divider may cause a step change in frequency that is undesirable. Depending upon the application, the designer may need to limit the size of the change. One way to do this is to limit the slew rate of the VCO, such that it cannot make large step changes in frequency.

One of skill in the art could implement the teachings of the present invention with a linear equation to adjust one or more controlled parameters of the PLL based on one or more monitored inputs. However, as described above, the preferred embodiment uses two or more states with fixed values for the controlled parameters.

Example of Implementation

In order to provide additional information to help illustrate the many ways that this present invention can be implemented, applicants provide the following details on an unusual implementation of the present invention.

FIG. 5 illustrates the general progression from Transmit Bits 10 from a first circuit through Encapsulating Device 14 to Transmit Packets 20 through the Packet Network 24 to Arriving Packets 30 through de-encapsulation and a Jitter Absorption Buffer (JAB) 34 to become a stream of Receive Bits 40. Consider a CBR (constant bit rate) application where the bits are created at constant rate R. The rate R remains constant because there are no pauses in the data stream. The application at the receiving end is typically set to receive and process bits at a clock speed proportional to the same rate R. On the path from creation to processing at the receive end the Transmit Bits 10 first arrive at a device that encapsulates them into packets and injects the Transmit Packets 20 into a Packet Network 24 at rate P. Just as the bits arrive from the application at regular intervals, the Encapsulating Device 14 sends out Transmit Packets 20 at regular intervals. However, the intervening packet network is not perfect, so it introduces packet delay variation (PDV) due to congestion.

A system that is receiving packets from a network that introduces PDV will see the incoming packets arrive at a rate that over a large period of time averages out to be the creation rate P (assuming packets are not lost entirely and the packet size is fixed). But from moment to moment, the receive rate varies as congestion in the network causes variation in the amount of time for a packet to traverse the network. The Arriving Packets 30 are processed at the receive end and the various headers and overhead are removed before the remaining payload data is placed into the JAB 34. The data stream of bits leaving the JAB 34 are clocked by Reference Clock Value 140. The JAB 34 buffers the system by having a queue of received payload data so that a steady stream of receive bits 40 can be released.

One of skill in the art should appreciate that the transmission of bits at a constant bit rate serves as a clock signal and the irregularities associated with the receipt of bits at the JAB reflects jitter in the received clock signal. As the JAB receives this jittered clock signal and the Reference Clock Value 140, the JAB 34 can serve as the Phase Detector 108. (Actually, it is more robust than classic phase detectors as a classic phase detector has the capacity to measure phase errors up to ±179.9 degrees and the JAB is not limited in this way).

The JAB depth/Phase Error 112 is periodically passed to the Low Pass Filter 116. In one preferred embodiment, the JAB depth is measured in bytes of payload data. In a preferred embodiment, the Low Pass Filter 116 implements a smoothing function on the values passed from the JAB and thus implements an exponential filter to provide the functionality of a low pass filter. The Filtered Phase Error 120 is then fed into a Voltage-Controlled Oscillator (VCO) 124. The Output 132 of the VCO 124 is fed back to the Phase Detector 108 as the Reference Clock Value 140, after passing through a Divider 136.

Variations of the JAB depth over time are used to create a metric that represents certain components of packet delay variation (jitter). A preferred metric is the periodic subtraction of the lowest JAB depth for a period of time (LWM) from the highest JAB depth for a period of time (HWM). This Metric 110 is provided to the Analysis Block 304 which drives the Parametric Control Block 308. The Parametric Control Block 308 impacts changes to the smoothing function in the Low Pass Filter 116 which impacts the gain for the low pass filter ($K_F$) and the natural frequency of the low pass filter ($\omega_N$).

The system as shown in FIG. 5 is useful for implementing adaptive timing for the drain rate of the JAB 34. For example, an application using a T1 line uses a rate centered on 1.544 Mbps but this rate can be adjusted up or down by up to 50 ppm. This tends to center the depth of the JAB as some prescribed center value. As shown in FIG. 5, the output 40 of the JAB 34 can be clocked by the Reference Clock Value 140 and provided to a T1 Transceiver 44 which further processes the data to provide a T1 Output Stream 48. This example is to further illustrate industrial applicability, however, and feeding a T1 Transceiver or another constant bit rate transceiver is certainly not a requirement of the present invention.

In a co-pending application Ser. No. 10/190,416 for Use of a Circular Buffer to Assure In-Order Delivery of Packets teaches methods that avoid a rapid change in the adaptive timing resulting from the transmission loss of a packet. The '416 application claims priority from U.S. Provisional Patent Application No. 60/304,062 for Use of A Circular Buffer to Assure In-Order Delivery of Packets. Note that the teachings of the present application can be implemented without the implementation of the teachings of the '416 application.

In order to promote clarity in the description, common terminology for components is used. The use of a specific term for a component suitable for carrying out some purpose within the disclosed invention should be construed as including all technical equivalents which operate to achieve the same purpose, whether or not the internal operation of the named component and the alternative component use the same principles. The use of such specificity to provide clarity should not be misconstrued as limiting the scope of the disclosure to the named component unless the limitation is made explicit in the description or the claims that follow.

Those skilled in the art will recognize that the methods and apparatus of the present invention have many applications and that the present invention is not limited to the specific examples given to promote understanding of the present invention. Moreover, the scope of the present invention covers the range of variations, modifications, and substitutes for the system components described herein, as would be known to those of skill in the art.

The legal limitations of the scope of the claimed invention are set forth in the claims that follow and extend to cover their legal equivalents. Those unfamiliar with the legal tests for equivalency should consult a person registered to practice before the patent authority which granted this patent such as the United States Patent and Trademark Office or its counterpart.

| ACRONYMS | |
|---|---|
| LPF | Low Pass Filter |
| PLL | Phase-Locked Loop |
| VCO | Voltage Controlled Oscillator |

We claim:

1. A method for dynamically varying the characteristics of a phase-locked loop, the method comprising:

monitoring the jitter of one portion of the phase-locked loop to obtain a monitored jitter value;

comparing the monitored jitter value with a set of threshold values corresponding to control states; and upon detection of the movement of the monitored jitter across a threshold value, changing a gain value for the phase-locked loop and changing a natural frequency for a low pass filter in the phase-locked loop.

2. The method of claim 1 wherein the threshold value to go from the lowest state to the second lowest state is at (L plus delta) and the threshold value to go from the second lowest state to the lowest state is at (L minus delta).

3. The method of claim 1 wherein the step of monitoring of the jitter is achieved by monitoring the jitter of the input clock to the phase-lock loop.

4. The method of claim 1 wherein the phase-lock loop is comprised of:

a phase detector that detects and outputs a phase error between an input clock signal and a reference clock signal;

a low pass filter that takes the outputted phase error and outputs a filtered phase error;

a voltage controlled oscillator that outputs an output clock signal based on the filtered phase error;

a divider that takes the output clock signal and divides by N to create the reference clock signal provided to the phase detector;

wherein the monitoring step monitors the jitter of the reference clock.

5. The method of claim 1 wherein the phase-lock loop is comprised of:

a phase detector that detects and outputs a phase error between an input clock signal and a reference clock signal;

a low pass filter that takes the outputted phase error and outputs a filtered phase error;

a voltage controlled oscillator that outputs an output clock signal based on the filtered phase error;

a divider that takes the output clock signal and divides by N to create the reference clock signal provided to the phase detector;

wherein the monitoring step monitors the jitter of the filtered phase error.

6. The method of claim 1 wherein the phase-lock loop is comprised of:

a phase detector that detects and outputs a phase error between an input clock signal and a reference clock signal;

a low pass filter that filters the outputted phase error and outputs a filtered phase error;

a voltage controlled oscillator that outputs an output clock signal based on the filtered phase error;

a divider that takes the output clock signal and divides by N to create the reference clock signal provided to the phase detector;

wherein the phase detector is a jitter absorption buffer and the phase detector outputs the depth of the jitter absorption buffer to the low pass filter.

7. The method of claim 6 wherein the monitoring step monitors a metric representative of the current level of jitter in the input to the jitter absorption buffer and the monitored metric is not the current depth of the jitter absorption buffer.

8. A method for dynamically varying the characteristics of a phase-locked loop, the phase-lock loop is comprised of:
   a phase detector that detects and outputs a phase error between an input clock signal and a reference clock signal;
   a low pass filter that takes the outputted phase error and filters the phase error in accordance with a first set of filter properties and outputs a filtered phase error;
   a voltage controlled oscillator that outputs an output clock signal based on the filtered phase error;
   a divider that takes the output clock signal and divides by N to create the reference clock signal provided to the phase detector; the method comprising:
   a) creating a filtered jitter metric based on the outputted phase error after filtering through a filter with a second set of filter properties wherein the second set of filter properties are not necessarily the same as the first set of filter properties;
   b) comparing the filtered jitter metric with a set of threshold values corresponding to control states; and
   c) upon detection of movement of the filtered jitter metric across a threshold value, thus triggering a state change from a first state to a second state, changing a set of at least one characteristic of the phase-lock loop from a set of at least one characteristic associated with the first state to a set of at least one characteristic associated with the second state.

9. A control system for dynamically adjusting parameters of a phase-locked loop, the phase-lock loop comprising:
   an input clock;
   a phase detector that compares the input clock with a reference clock and outputs a phase error, the phase detector having a gain, $K_P$;
   a low pass filter that filters the phase error to output a filtered phase error;
   the low pass filter having a gain of $K_F$ and a natural frequency of $\omega_N$;
   a voltage controlled oscillator that produces an output clock based on the filtered phase error, the voltage controlled oscillator having a gain of $K_V$; and
   a divider that divides the output clock by N to produce a reference clock;
   the control system comprising:
      a jitter value input to the control system containing at least one jitter value for the phase-lock loop;
      a set point A for transition from the lowest state in the control system to the second lowest state in the control system when the jitter value input crosses from less than A to more than A; and
      a first rule triggered by the movement of the jitter value input from less than set point A to slightly more than set point A, the triggering of the first rule causing a change in a controlled gain from the value associated with the lowest state to a value associated with the second lowest state.

10. The control system of claim 9 wherein the first rule also causes a change in the controlled natural frequency $\omega_N$ of the low pass filter from a frequency value associated with the lowest state to a frequency value associated with the second lowest state.

11. The control system of claim 9 wherein the jitter value for the phase-locked loop is a jitter value representative of the input clock.

12. The control system of claim 9 wherein the jitter value for the phase-locked loop is a jitter value representative of the reference clock.

13. The control system of claim 9 wherein the jitter value for the phase-locked loop is a jitter value representative of the filtered phase error.

14. A control system for dynamically adjusting parameters of a phase-locked loop, the phase-lock loop comprising:
   an input clock;
   a phase detector that compares the input clock with a reference clock and outputs a phase error, the phase detector having a gain, $K_P$;
   a low pass filter that filters the phase error to output a filtered phase error;
   the low pass filter having a gain of $K_F$ and a natural frequency of $\omega_N$;
   a voltage controlled oscillator that produces an output clock based on the filtered phase error, the voltage controlled oscillator having a gain of $K_V$; and
   a divider that divides the output clock by N to produce a reference clock;
   the control system comprising:
      a jitter value input to the control system containing at least one jitter value for the phase-lock loop;
      a set point A for transition from the lowest state in the control system to the second lowest state in the control system when the jitter value input crosses from less than A to more than A; and
      a first rule triggered by the movement of the jitter value input from less than set point A to slightly more than set point A, the triggering of the first rule causing a change in the controlled natural frequency of the low pass filter from the value associated with the lowest state to a value associated with the second lowest state.

15. A circuit emulation system with a receiving system to receive a data stream of packets from a sending system, the sending system of the type:
   a first circuit creating output of payload data at a constant bit rate, the output of bits encapsulated into packets before transmission through a packet network, the packets destined for the receiving system;
   the receiving system comprising:
      a stripper to remove the payload data from the received packets;
      a jitter absorption buffer to receive the payload data from the stripper;
      a low pass filter receiving measurements of the depth of the jitter absorption buffer and outputting a filtered depth of the jitter absorption buffer;
      a voltage controlled oscillator that outputs a clock signal based on the filtered phase error, the clock signal used to clock the flow of output bits of data from the jitter absorption buffer such that an increase in jitter absorption buffer depth causes an increase of a drain rate of the jitter absorption buffer and a decrease in jitter absorption buffer depth causes a decrease in the drain rate of the jitter absorption buffer; and
      a control scheme that monitors a metric indicative of current network conditions to alter a set of at least one controlled parameter for the receiving system from a first set of at least one parameter to a second set of at least one parameter such that the drain rate of the jitter absorption buffer at a first depth when the first set of at least one parameter is in use is different from the drain rate of the jitter absorption buffer at the same first depth when the second set of at least one parameter is in use.

16. The circuit emulation system of claim 15 wherein the set of at least one controlled parameter includes a gain value and a natural frequency for the low pass filter.

17. The circuit emulation system of claim 15 wherein the jitter absorption buffer depth is measured in bytes of payload.

18. The circuit emulation system of claim 15 wherein the flow of output bits from the jitter absorption buffer feeds a constant bit rate transceiver.

19. The circuit emulation system of claim 15 wherein the metric indicative of current network conditions is derived from periodically collecting the maximum depth of the jitter absorption buffer and the minimum depth of the jitter absorption buffer for a given period of time.

20. The circuit emulation system of claim 15 wherein clock signal from the voltage controlled oscillator is processed by a divider that takes the clock signal and divides by N.

21. The circuit emulation system of claim 15 wherein the control scheme that monitors the metric indicative of current network conditions to alter the set of at least one controlled parameter for the receiving system from a first set of at least one parameter to a second set of at least one parameter uses at least one linear equation to calculate the value of at least one controlled parameter based on the metric indicative of current network conditions.

22. The circuit emulation system of claim 15 wherein the control scheme that monitors the metric indicative of current network conditions to alter the set of at least one controlled parameter for the receiving system from the first set of at least one parameter to the second set of at least one parameter uses a set of at least one threshold value to discern whether a change in the monitored metric triggers a state change that alters the set of at least one controlled parameter from the first set of at least one parameter to the second set of at least one parameter.

* * * * *